United States Patent
Panesar

(10) Patent No.: US 10,866,279 B2
(45) Date of Patent: Dec. 15, 2020

(54) MONITORING ACCESSES TO A REGION OF AN INTEGRATED CIRCUIT CHIP

(71) Applicant: UltraSoC Technologies Limited, Cambridge (GB)

(72) Inventor: Gajinder Singh Panesar, Cambridge (GB)

(73) Assignee: ULTRASOC TECHNOLOGIES LIMITED, Cambridge (GB)

(*) Notice: Subject to any disclaimer, the term of this patent is extended or adjusted under 35 U.S.C. 154(b) by 99 days.

(21) Appl. No.: 16/292,530

(22) Filed: Mar. 5, 2019

(65) Prior Publication Data

US 2019/0277912 A1    Sep. 12, 2019

(30) Foreign Application Priority Data

Mar. 6, 2018 (GB) .................... 1803551.9

(51) Int. Cl.
*G01R 31/02* (2006.01)
*G01R 31/26* (2020.01)
(Continued)

(52) U.S. Cl.
CPC ... *G01R 31/31717* (2013.01); *G01R 31/2803* (2013.01); *G01R 31/2853* (2013.01); *G01R 31/2884* (2013.01); *G01R 31/2889* (2013.01); *G01R 31/2896* (2013.01); *G01R 31/66* (2020.01); *G06F 11/2242* (2013.01);
(Continued)

(58) Field of Classification Search
CPC ....... H01L 2924/00; H01L 2924/00014; H01L 2924/0002; H01L 2224/48091; G01R 31/2896; G01R 31/2884; G01R 31/2853; G01R 31/2889

USPC ......... 324/71, 378, 403, 415, 425, 500, 537, 324/762.01, 762.02
See application file for complete search history.

(56) References Cited

U.S. PATENT DOCUMENTS

2006/0150255 A1    7/2006  Ceskutti
2015/0058931 A1*   2/2015  Miu .................. G06Q 20/4016
                                                            726/3
(Continued)

FOREIGN PATENT DOCUMENTS

WO    WO 2016/032861 A1    3/2016

OTHER PUBLICATIONS

Search Report for corresponding Appl No. GB1803551.9, dated Sep. 6, 2018.

*Primary Examiner* — Raul J Rios Russo
(74) *Attorney, Agent, or Firm* — Lempia Summerfield Katz LLC

(57) ABSTRACT

An integrated circuit chip comprising: system circuitry comprising interconnect circuitry for transporting transactions; and monitoring circuitry configured to: monitor transactions from the interconnect circuitry comprising transactions between an entity and a specified region of the integrated circuit chip, the entity being associated with a set of one or more access rights for accessing the specified region of the integrated circuit chip; determine from the monitored transactions values of one or more parameters associated with the access to the specified region by the entity to identify whether the entity has breached its access rights; and perform a dedicated action indicative of a breach of the access rights in response to determining from the parameter values that the entity has breached its access rights.

20 Claims, 4 Drawing Sheets

(51) Int. Cl.
*G01R 31/317* (2006.01)
*G06F 11/22* (2006.01)
*G01R 31/28* (2006.01)
*G01R 31/66* (2020.01)

(52) U.S. Cl.
CPC .............. *H01L 2224/48091* (2013.01); *H01L 2924/00* (2013.01); *H01L 2924/0002* (2013.01); *H01L 2924/00014* (2013.01)

(56) References Cited

U.S. PATENT DOCUMENTS

| | | |
|---|---|---|
| 2016/0357991 A1 | 12/2016 | Hershman et al. |
| 2019/0166110 A1* | 5/2019 | Miu ........................ H04L 63/08 |
| 2020/0145399 A1* | 5/2020 | Miu ........................ H04L 63/08 |

* cited by examiner

MONITORING ACCESSES TO A REGION OF AN INTEGRATED CIRCUIT CHIP

FIELD

This invention relates to monitoring accesses to a region of an integrated circuit chip, and in some aspects, taking a dedicated action in response to a breach in access rights to the region.

BACKGROUND

In the past, an embedded system which had multiple core devices (processors, memories etc.) would have been incorporated onto a Printed Circuit Board (PCB) and connected on the PCB via buses. Traffic in the embedded system was conveyed over these buses.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses.

The security of SoC devices is of concern, particularly as SoC devices are implemented within devices such as smartphones, cameras, computers, laptops etc. with increasing network connectivity, exposing the SoC devices to a wide range of security threats. The security of SoC devices may be compromised by entities attempting to gain access (either physical access or logical access) to components of the SoC device. As such, consideration of the security of the SoC device is often an important consideration during the design stage of the system.

SUMMARY

According to the present invention there is provided a method of controlling access to a specified region of an integrated circuit chip, comprising:

monitoring transactions over interconnect circuitry of the integrated circuit chip comprising transactions between an entity and the specified region of the integrated circuit chip, the entity being associated with a set of one or more access rights to the specified region of the integrated circuit chip;

determining from the monitored transactions between the entity and the specified region of the integrated circuit chip values of one or more parameters associated with the access to the specified region by the entity to identify whether the entity has breached its access rights; and in response to determining from the parameter values that the entity has breached its access rights, performing a dedicated action indicative of a breach of those access rights.

The values of the one or more parameters associated with the access to the specified region may be determined using the monitored transactions between the first entity and the specified region.

The access rights may be specified in terms of limiting values of the one or more parameters associated with the access to the specified region.

The method may further comprise comparing the values of the one or more parameters associated with the access to the specified region determined from the monitored transactions with the limiting values of those one or more parameters to identify whether the entity has breached its access rights.

The one or more parameters associated with the access to the specified region may include at least one of: a time value for each monitored transaction; the number of accesses to the specified region of the integrated circuit chip within a specified time interval; a state of the integrated circuit chip; a sequence of previous accesses made by the entity; whether the access was requested via a specified subsystem.

The dedicated action indicative of a breach of the entity's access rights may comprise one or more of: blocking access to the specified region of the integrated chip circuit by the entity; generating an alert signal; and outputting trace data of accesses to the specified region by the entity.

The entity may be a hardware entity. The entity may be a logical entity. The entity may be located on the integrated circuit chip. The entity may be located off the integrated circuit chip.

The specified region may be a memory on the integrated circuit chip.

The method further may comprise using the monitored transactions to record information associated with accesses of the entity to the specified region over time to generate an access profile for the entity composed of one or more profile parameters.

The method may comprise analyzing a set of one or more monitored transactions between the entity and the specified region to determine whether a corresponding set of accesses by the entity matches the generated access profile.

The method may comprise performing the dedicated action indicative of a breach of the access rights further in response to determining that a set of one or more accesses by the entity does not match the generated access profile.

The profile parameters may include one or more of: frequency of accesses to the specified region by the entity; frequency of one or more types of access to the specified region by the entity; a sequence of accesses to regions of the integrated circuit chip by the entity.

The frequency of one or more types of access to the specified region may include at least one of: frequency of read accesses; frequency of write access; frequency of interrupts.

The method may further comprise using the monitored transactions to record information associated with accesses to the specified region of the integrated circuit chip over time to generate an access profile for the specified region composed of one or more profile parameters.

The method may comprise analyzing a set of one or more monitored transactions involving the specified region to determine whether a corresponding set of accesses to the specified region matches the generated access profile for the specified region.

The method may comprise performing the dedicated action indicative of a breach of the access rights further in response to determining that a set of accesses to the specified region does not match the access profile for the specified region.

The one or more profile parameters may compose the access profile for the specified region comprise at least one of: frequency of accesses to the specified region; frequency of types of accesses to specified region; timing of accesses to the specified region.

The frequency of one or more types of access to the specified region may include at least one of: frequency of read accesses; frequency of write access; frequency of interrupts.

According to a another aspect there is provided an integrated circuit chip comprising:

system circuitry comprising interconnect circuitry for transporting transactions; and monitoring circuitry configured to:
  monitor transactions from the interconnect circuitry comprising transactions between an entity and a specified region of the integrated circuit chip, the entity being associated with a set of one or more access rights for accessing the specified region of the integrated circuit chip;
  determine from the monitored transactions values of one or more parameters associated with the access to the specified region by the entity to identify whether the entity has breached its access rights; and
  perform a dedicated action indicative of a breach of the access rights in response to determining from the parameter values that the entity has breached its access rights.

The monitoring circuitry may be configured to determine the values of the one or more parameters associated with the access to the specified region using the monitored transactions between the first entity and the specified region.

The access rights may be specified in terms of limiting values of the one or more parameters associated with the access to the specified region.

The monitoring circuitry may be configured to compare the values of the one or more parameters associated with the access to the specified region determined from the monitored transactions with the limiting values of those one or more parameters to identify whether the entity has breached its access rights.

The one or more parameters associated with the access to the specified region may include at least one of: a time value for each monitored transaction; the number of accesses to the specified region of the integrated circuit chip within a specified time interval; a state of the integrated circuit chip; a sequence of previous accesses made by the entity; whether the access was requested via a specified subsystem.

The dedicated action indicative of a breach of the entity's access rights may comprise one or more of: blocking access to the specified region of the integrated chip circuit by the entity; generating an alert signal; and outputting trace data of accesses to the specified region by the entity.

The entity may be located on the integrated circuit chip. The entity may be a hardware entity. The entity may be a logical entity.

The specified region may be a memory on the integrated circuit chip.

The monitoring circuitry may be configured to record in a storage unit information associated with accesses of the entity to the specified region over time to generate an access profile for the entity composed of one or more profile parameters.

The storage unit may be located on the integrated circuit chip.

The monitoring circuitry may be configured to analyze a set of one or more monitored transactions between the entity and the specified region to determine whether a corresponding set of accesses by the entity matches the generated access profile.

The monitoring circuitry may be configured to perform the dedicated action further in response to determining that a set of one or more accesses by the entity does not match the generated access profile.

The profile parameters may include one or more of: frequency of accesses to the specified region by the entity; frequency of one or more types of access to the specified region by the entity; a sequence of accesses to regions of the integrated circuit chip by the entity.

The one or more types of access to the specified region may include at least one of: frequency of read accesses; frequency of write access; frequency of interrupts.

The monitoring circuitry may be further configured to use the monitored transactions to record in the storage unit information associated with accesses to the specified region of the integrated circuit chip over time to generate an access profile for the specified region composed of one or more profile parameters.

The monitoring circuitry may be configured to analyze a set of one or more monitored transactions involving the specified region to determine whether a corresponding set of accesses to the specified region matches the generated access profile for the specified region.

The monitoring circuitry may be configured to perform the dedicated action further in response to determining that a set of accesses to the specified region does not match the access profile for the specified region.

The one or more profile parameters composing the access profile for the specified region may comprise at least one of: frequency of accesses to the specified region; frequency of types of accesses to specified region; timing of accesses to the specified region.

The frequency of one or more types of access to the specified region may include at least one of: frequency of read accesses; frequency of write access; frequency of interrupts.

Any of the methods described herein may be performed for chip security.

Any of the methods described herein may be performed for chip safety.

Any of the methods described herein may be performed during chip analytics.

The monitoring circuitry as described herein may be configured to monitor transactions for chip security.

The monitoring circuitry as described herein may be configured to monitor transactions for chip safety.

The monitoring circuitry as described herein may be configured to monitor transactions during chip analytics.

BRIEF DESCRIPTION OF FIGURES

The present invention will now be described by way of example with reference to the accompanying drawings. In the drawings.

DETAILED DESCRIPTION

The following disclosure describes a monitoring architecture for monitoring accesses to a specified region of an integrated circuit chip. The monitoring architecture may be implemented on the integrated circuit chip. The integrated circuit chip may be an SoC or a multi-chip module (MCM). The specified region of the chip may be a secure part of the chip for which it is desirable to control access. The specified region may for example be an on-chip memory (or a region of on-chip memory); a region including one or more peripheral blocks; or part of a peripheral block etc. The monitoring architecture monitors accesses to the specified region made by one or more entities. These entities may be physical or logical entities, and may be located either on-chip or off-chip. Each entity is associated with a set of one more access rights. By monitoring accesses to the specified region of the chip made by the entities, the monitoring architecture can determine if or when an entity exceeds, or breaches, its access rights. In response, the monitoring architecture may perform a dedicated function indicative of a breach of the access rights. The dedicated action could be, for example, blocking further access to the specified region for the entity determined to have breached its access rights.

Figure 1:
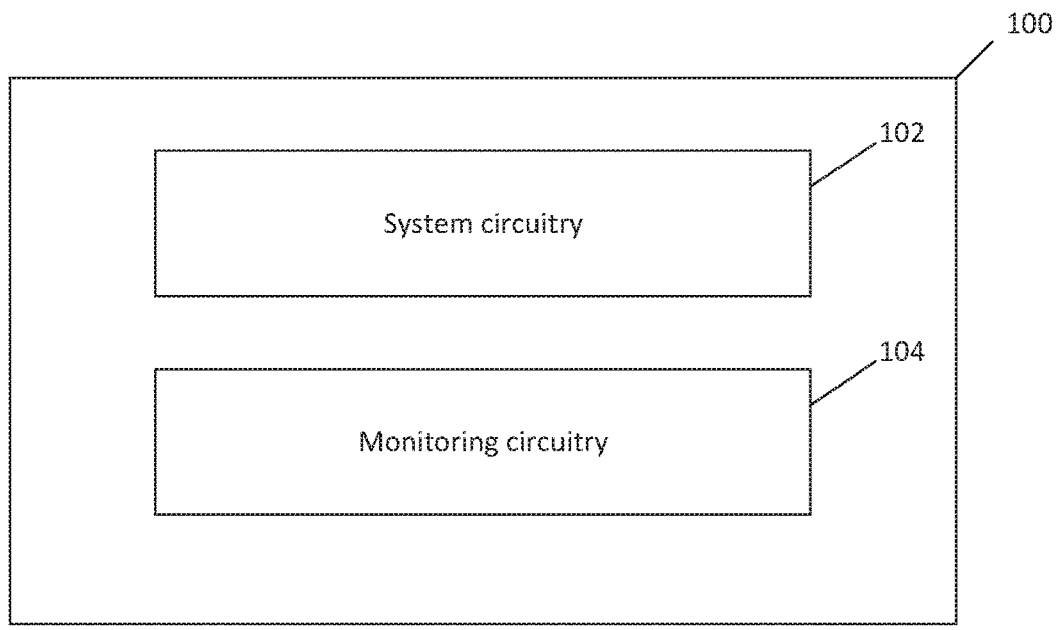
FIG. 1 is a schematic diagram of the architecture on an integrated circuit chip.
Figure 2:
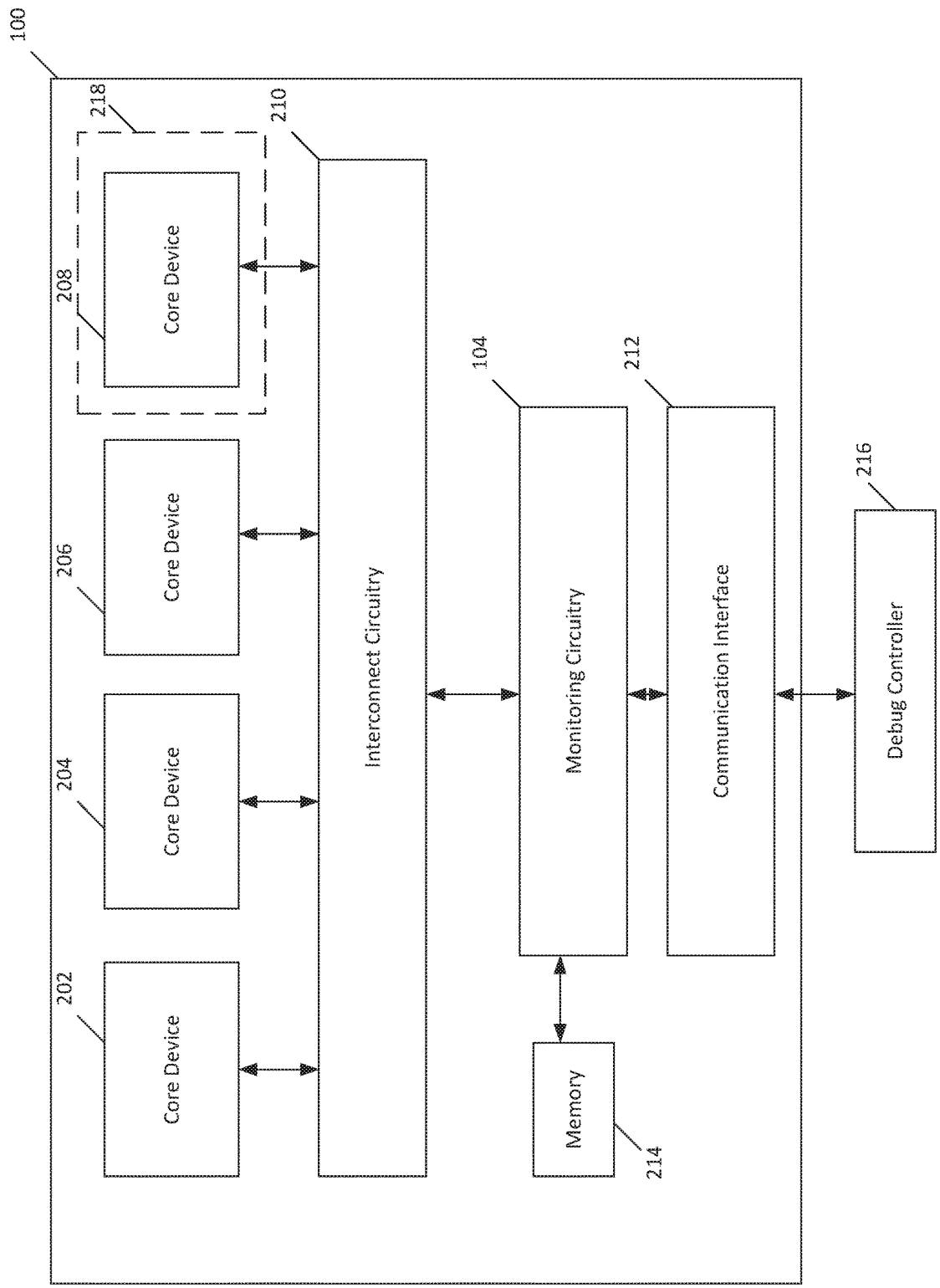
FIG. 2 is a schematic diagram of the architecture on an integrated circuit chip.
Figure 3:
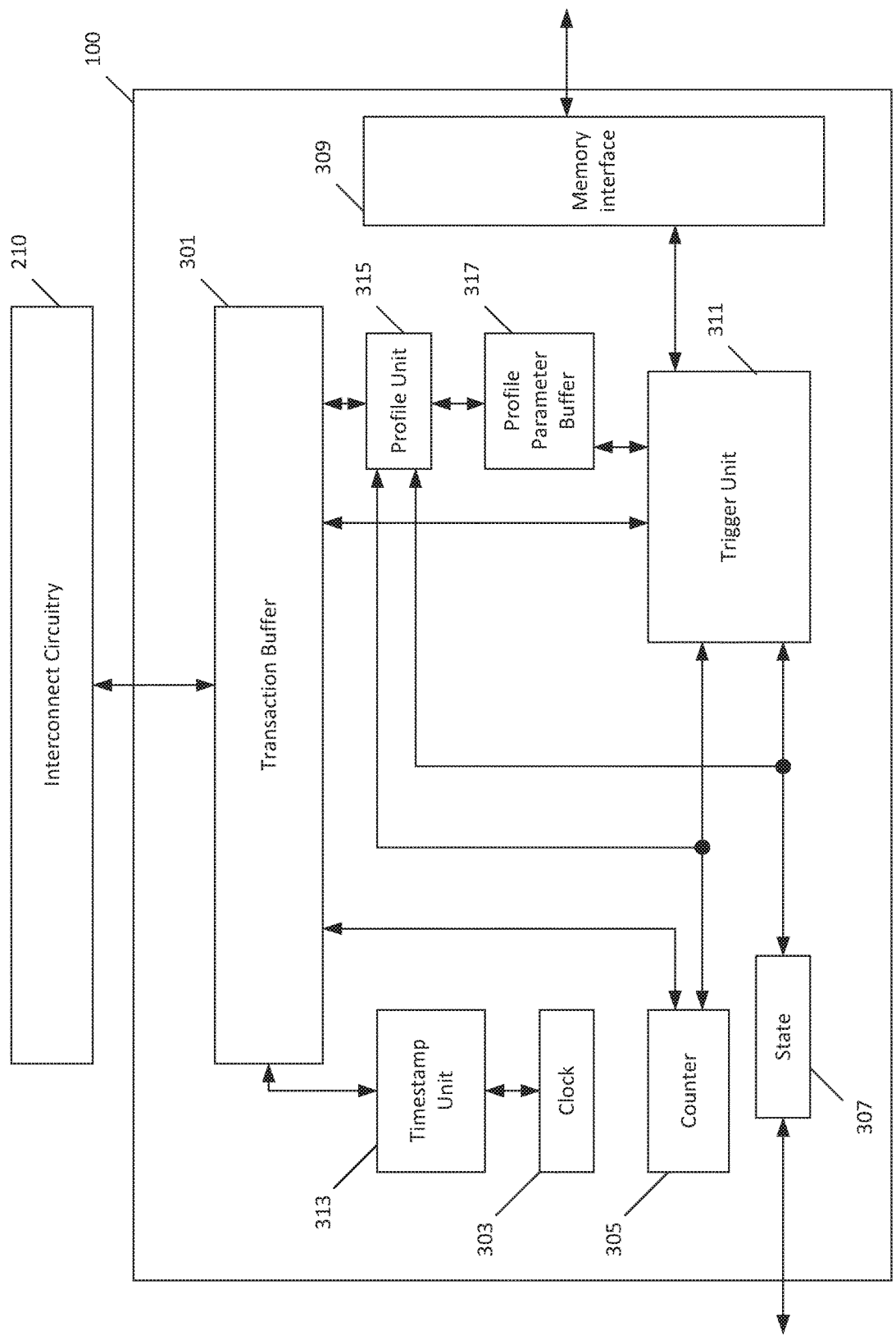
FIG. 3 is a schematic diagram of monitoring circuitry for monitoring accesses to a region of the integrated circuit chip.

FIGS. 1 to 3 are schematic diagrams of SoC architectures, and components within SoC architectures. These figures present the structures in terms of functional blocks. Some functional blocks for carrying out functions well known in the art have been omitted. The functional blocks may not delineate different physical structures and may not define a strict division between different logic elements of the SoC device. Each functional block may be implemented in hardware, software, or a combination thereof.

Figure 4:
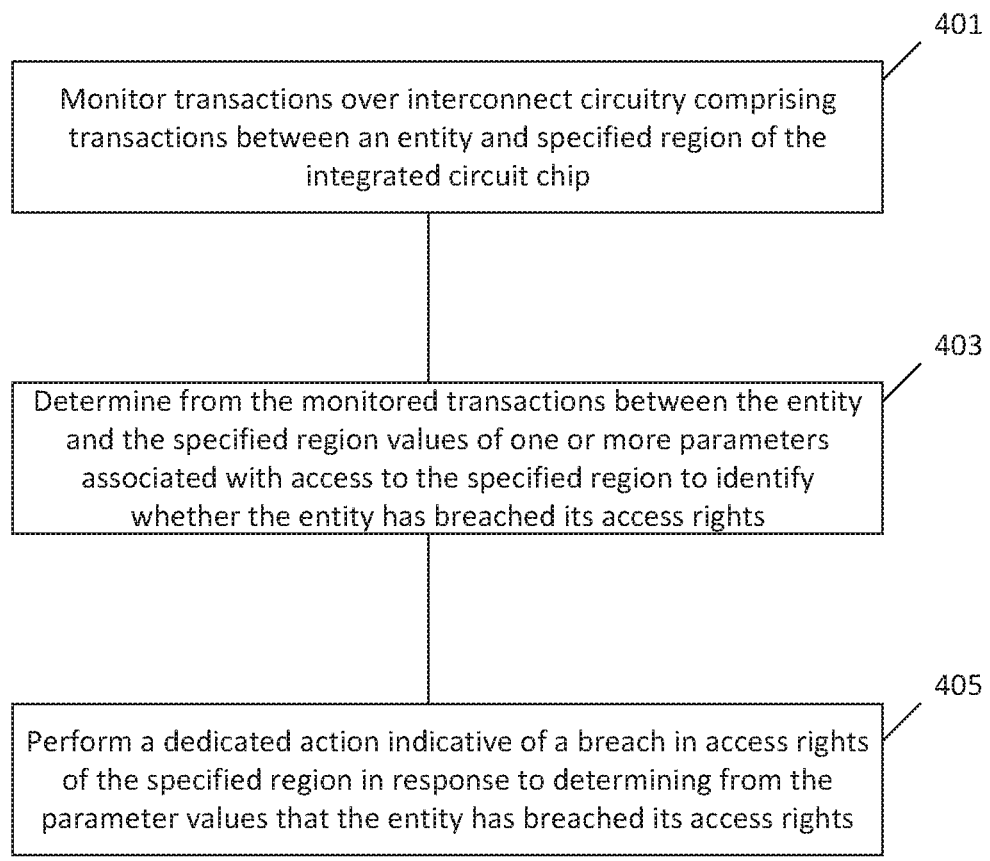
FIG. 4 is a flowchart of method steps for monitoring accesses to a region of the integrated circuit chip.

FIG. 4 shows a flowchart of steps of a method of monitoring accesses to a specified region of an integrated circuit chip. The flowchart depicts an order in which the steps of the method may be performed. However, the flowchart is not intended to restrict the order in which the steps of the method can be performed. The steps of the method may be carried out in alternative orders to that depicted in FIG. 4. The steps of the method may also be implemented concurrently with each other so that the implementation of different steps may at least partially overlap in time.

FIG. 1 illustrates the general structure of an exemplary monitoring architecture for a SoC 100. The SoC comprises system circuitry 102 and monitoring circuitry 104. The monitoring circuitry is arranged to monitor the system circuitry 102. In particular, the monitoring circuitry is arranged to monitor accesses to regions of the SoC made by one or more entities to identify if and when those entities breach their access rights.

FIG. 2 shows a more detailed view of the exemplary architecture of the SoC 100. The system circuitry is shown comprising a number of core devices 202, 204, 206, 208; interconnect circuitry 210; and a communication interface 212. Although four core devices are shown here, it will be appreciated that this is merely for the purposes of illustration and any number of core devices may suitably be implemented within the SoC. Exemplary core devices include a DSP (digital signal processor), video processor, applications processor or CPU (central processor unit), graphics processor or GPU (graphics processor unit), system memory, bus, software, data, custom circuit and a data engine. This list of examples is non-limiting, and any component of a SoC is suitable for being incorporated into the architecture shown in FIG. 2 as a core device. The core devices may be emulators or simulators of other devices on the chip. For example, a core device may emulate a processor.

Each core device is shown connected to the monitoring circuitry 104 via interconnect circuitry 210. The interconnect circuitry may be a bus. The system interconnect is a further example of a core device; however, system interconnect circuitry is shown in FIG. 2 as a separate component for the purpose of clarity. The interconnect circuitry transports data between components of the SoC as transactions in accordance with a transaction protocol. A transaction may involve one or more messages being communicated between components of the SoC. The interconnect circuitry may for example transport transactions between different core devices. Each transaction message communicated over the interconnect circuitry in accordance with the transaction protocol may comprise a number of fields. Each transaction message could for example include an address field. The address field may contain an indication of the address of the device or component within the SoC that initiated the transaction (referred to herein as a master device/component). Alternatively or in addition, the address field may contain an indication of the address of the device or component within the SoC that is intended to receive the transaction (referred to herein as a slave device/component).

The monitoring circuitry 104 is configured to monitor accesses to a specified region of the SoC to identify when one or more entities breach their access rights. This will be explained in more detail below. The monitoring circuitry may also be configured to monitor, analyze, control, or manipulate the operation of the core devices. The monitoring circuitry may additionally comprise circuitry for implementing debugging functionality. This circuitry may be referred to as debugging circuitry. The debugging circuitry may be configured to detect bugs, and may be utilized to profile usage of resources or components (e.g. core devices, such as on-chip memory) on the SoC.

The monitoring circuitry 104 is shown connected to a memory 214. The memory 214 may be a non-volatile memory. The memory 214 may be a separate memory from the main system memory on the chip 100. The memory 214 may store data generated by, and/or for use by, the monitoring circuitry 104.

The monitoring circuitry 104 is also shown connected to communication interface 212. Communication interface 204 may be configured to communicate with entities off chip (i.e. entities external to the chip 100). For example, the monitoring circuitry 104 may communicate with an off-chip debug controller 216 via the communication interface 212. Communication interface 212 may also be configured to communicate with other entities on-chip. For example, monitoring circuitry 104 may communicate with an on-chip debug controller via communication interface 212. Although FIG. 2 illustrates one communication interface, any number of communication interfaces can be integrated onto the SoC. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe and CAN A method will now be described in which accesses to a specified region of the chip 100 are monitored. The specified region may be a region to which accesses are to be controlled. It may be a secure region of the chip. The specified region may be a region that includes one or more core devices of the chip. The specified region may be a region, or portion, of a single core device. Alternatively, the specified region may be defined by portions of respective core devices. That is, the specified region may not be a continuous region of the chip. The specified region may be, or may include, one or more core devices. An exemplary specified region is illustrated schematically in FIG. 2 at 218. In this example, the specified region 218 includes core device 208. The core device 208 may be memory in a secure part of the chip. It could for example be a system memory of the chip 100.

In the example that follows, the monitoring circuitry 104 operates to monitor accesses to the region 218 by a first entity. The first entity may be an entity for which access to the specified region is to be controlled, or monitored. The entity may be a physical entity, for example another core device 202, 204, 206, or a debug controller such as off-chip controller 216 or an on-chip controller. Alternatively, the entity may be a logical entity. The entity may be located on chip 100 or off chip 100.

The degree or level to which the entity can access the specified region 218 may be specified by a set of one or more access rights associated with the entity. The access rights might be predetermined at run-time of the chip. The access rights to the specified region may for example be set during a configuration stage of the chip, e.g. by an on-chip access controller. In this example, the access rights are stored in the local memory 214. In other implementations, the access rights may be stored locally to the monitoring circuitry 104, for example within the monitoring circuitry 104.

The method will now be described with reference to the flow chart shown in FIG. 4.

At step 401, the monitoring circuitry 104 monitors transactions over the interconnect circuitry 210 between the first entity and the specified region of the integrated circuit chip 100.

The monitoring circuitry may be configured to monitor the transactions whilst the interconnect circuitry continues operating under normal conditions. The monitoring circuitry may therefore be non-intrusive; i.e. it does not affect the transactions over the interconnect circuitry. Data communicated between two entities over the interconnect circuitry is therefore unaltered by the operation of the monitoring circuitry. The monitoring circuitry records parameter values associated with the transactions to enable a profile of the accesses to the specified region to be built up.

The monitoring circuitry 104 may monitor transactions over the interconnect circuitry in dependence on one or more parameters of the transactions. For example, the monitoring circuitry may record transactions in dependence on the values of the address fields in the transactions. For instance, the monitoring circuitry may record each transaction involving the specified region by recording those transactions that contain an address corresponding to an area of the chip within the specified region. If the specified region was memory in a secure region of the chip, the monitoring circuitry may record each transaction that contained an address of that memory. To reduce the number of transactions over the interconnect circuitry to be monitored, the monitoring circuitry may only record transactions that contain both an indication of the first entity (e.g. an address for the first entity), and an address corresponding to an area of the chip within the specified region. Alternatively, the monitoring circuitry may record each transaction over the interconnect circuitry, and then subsequently filter the transactions based on the address field to filter out transactions not involving the specified region and/or the first entity.

At step 403, the monitoring circuitry 104 determines, from the monitored transactions between the first entity and the specified region, values of one or more parameters associated with the access to the specified region. These parameters may be referred to herein as access parameters. The values for the access parameters are used by the monitoring circuitry to identify whether the first entity has breached its access rights.

In particular, the first entity's access rights to the specified region may be specified in terms of limiting values for the access parameters. The limiting values may specify requirements that need to be met in order for the first entity to not breach its access rights. The monitoring circuitry 104 may compare the values of the one or more access parameters determined from the monitored transactions with the corresponding limiting values of those parameters to determine whether the first entity has breached its access rights.

The monitoring circuitry may determine one or more access parameter values for each monitored transaction between the first entity and the specified region. Alternatively, the monitoring circuitry may determine the one or more access parameter values from a set of multiple monitored transactions between the first entity and the specified region. That is, the one or more access parameter values may be determined from a set of multiple transactions. In some implementations, the set of access parameters are partitioned into a first subset and a second subset, each including one or more access parameters. The monitoring circuitry may determine values of the first subset of access parameters for each monitored transaction between the first entity and specified region, and determine values of the second subset of access parameters from a group of multiple monitored transactions.

Various examples of access rights (and subsequent access parameters) will now be described.

The access rights for the first entity may specify that the first entity has time-limited access (i.e., it can only access the specified region 218 are specific times). An example of an access parameter is therefore time of access. The time of access may be determined from a time value associated with a transaction (e.g. a timestamp). The limiting value for the access parameter may therefore be a range of time values during which the first entity is permitted access to the specified region, or a range of time values during which the first entity is to be denied access the specified region. The monitoring circuitry can compare a time value associated with a transaction with the range of limiting time values to determine whether the transaction is occurring during a time in which access is permitted. Time of access is therefore an example of an access parameter that might be determined for each monitored transaction between the first entity and the specified region.

The access rights for the first entity may specify that the first entity can make only a limited number of accesses within a specified time period. An example of an access parameter is therefore the number of accesses within the specified time period (i.e. the frequency of accesses). The limiting value for this access parameter may be the maximum number of access permitted within the specified time period (i.e. a maximum frequency of access). The monitoring circuit 104 may then compare the number of accesses to the specified region made by the first entity within the specified time period (e.g. using the time values associated with each transaction) with the maximum number of permitted accesses within that time period. Frequency of access is therefore an example of an access parameter that is determined from a set of monitored transactions between the first entity and the specified region.

In a further development of this example, the access rights may limit the number or frequency of accesses that the first entity can make for each of a set of different access types. The types of accesses may include, for example, read accesses (where data is read from the specified region), write accesses (where data is written to the specified region) or interrupts. Limiting values for these access parameters may therefore be a maximum number or frequency of accesses of each type permitted.

The access rights for the first entity may specify that the first entity's access to the specified region is limited by the status of the integrated circuit chip 100. The first entity may only be permitted access the specified region when the chip is in one of a set of specific states, for example during boot time when the chip is in boot mode, and not permitted access to the specified region when the chip is in other states. An example of an access parameter is therefore the status, or state, of the chip at the time access to the specified region is requested. The limiting value for this parameter may be the chip state(s) in which the first entity is permitted to access the specified region, or the chip states in which the first entity is not permitted to access the specified region. This access parameter might be determined for each monitored transaction between the first entity and the specified region.

The access rights for the first entity may specify that the first entity is only permitted to access the specified region if the access is preceded by a required sequence of accesses (e.g., accesses to a sequence of regions on the chip). That is, the first entity may be required to access a sequence of regions on the chip (not including the specified region) before being permitted access to the specified region. In this case the access parameter may be a sequence of accesses made by the first entity. The limiting value for this parameter may be the required sequence(s) of accesses (i.e. the sequence of accesses required in order to be able to access the specified region). The sequence of accesses may be of a fixed length. The length may be predetermined (e.g. during the configuration stage of the chip). This is a further example of an access parameter that might be determined for each monitored transaction between the first entity and the specified region.

The access rights for the first entity may specify that the first entity is not permitted to access the specified region if the access was requested from, or via, one of a set of prohibited components. A prohibited component may be either an on-chip or off-chip component. This access right may prevent malicious entities from accessing the specified region. In this case the access parameter may be identities of the component(s) through which the access was requested, for example the identities of the component(s) through which the transaction was communicated. The limiting value for this parameter may be the identities of prohibited components, i.e. components not permitted to communicate or route access requests to the specified region. This is a further example of an access parameter that might be determined for each monitored transaction between the first entity and the specified region.

It will be appreciated from these examples that the access parameter values may not be specified directly by, or within, a transaction. Instead, a transaction may be used to determine a value of the access parameters. Other access parameter values may be specified directly within the transaction. If there are multiple access parameters, a subset of access parameter values may be specified within the transaction, and a subset of access parameter values may be determined using information associated with the transaction.

The access rights allocated to the first entity may include one or more of these exemplary access rights. The above set of access rights is non-exhaustive, and it will be appreciated that other types of access rights may be specified for the first entity.

An exemplary structure of the monitoring circuitry 104 that can identify if a first entity has breached its access rights is shown in more detail in FIG. 3.

As shown in FIG. 3, the monitoring circuitry 104 comprises a transaction buffer 301; a clock 303; a counter 305; a state memory 307; a memory interface 309; a trigger unit 311 and a timestamp unit 313. These components operate to determine the values of the one or more access parameters from the transactions between the first entity and the specified region 218 to identify whether the first entity has breached its access rights. The monitoring circuitry may optionally also comprise profile unit 315 and profile parameter buffer 317.

The trigger unit 311 operates to detect when the access parameters have values indicative of a breach in the access rights. That is, the trigger circuit operates to determine from the values of the access parameters whether the first entity has breached its access rights. As described above, whether the first entity has breached its access rights or not can be determined from a comparison of the determined access parameter values with the limiting values of those parameters defined by the first entity's access rights.

The trigger unit 311 is shown coupled to memory interface 309. Memory interface 309 interfaces with the local memory 214, which may store the access rights. In this example, trigger unit 311 reads the access rights stored in memory 214 via the memory interface 309. In other implementations, the access rights may be stored off-chip. In this case, those access rights may be read from off-chip via the memory interface 309. In another implementation, the access rights may be stored in a memory local to (e.g. within) the monitoring circuitry 104. In this case, the trigger unit 311 may read the access rights directly from the memory (i.e. not through the memory interface 309). If the access rights are stored locally to the circuitry 104, the circuitry 104 might not include memory interface 309.

Data for transactions between the first entity and the specified region that are monitored over the interconnect circuitry 210 can be stored in the transaction buffer 301. The transaction buffer may store all information for each monitored transaction (e.g. the information in the address field and data fields of each monitored transaction). That is, the transaction buffer may store a copy of the monitored transaction. Alternatively, to reduce storage requirements, the transaction buffer may store an identification of each transaction between the first entity and the specified region 218, e.g. a transaction number, or transaction ID. Data for the transactions being monitored over the interconnect circuitry may be duplicated and stored in the transaction buffer 301. That is, the monitoring circuitry may sniff the monitored transactions to store data for those transactions in the transaction buffer. This enables the monitoring circuitry 104 to monitor transactions over the interconnect circuitry non-intrusively.

The transaction buffer 301 may operate to store data for each transaction involving the first entity. That is, the transaction buffer may store data for each transaction between the first entity and some other component on the chip 100, not just those transactions between the first entity and the specified region 218. The transaction buffer could operate to store data for each transaction emanating from the first entity. The transaction buffer could further operate to store data for the monitored transactions in order (e.g. in temporal order, or in order of observation), and to store for each monitored transaction an indication of other components involved in the transaction. This information may be identified from the address field of the transactions. In this way, the indications of the components involved in the transactions with the first entity stored in the transaction buffer are representative of the sequence of accesses made by the first entity. In other words, the transaction buffer can operate so as to store a representation of the sequence of accesses made by the first entity.

In response to data for a transaction between the first entity and the specified region 218 being stored in the transaction buffer 301, the trigger unit 311 can determine from the transaction buffer a preceding sequence of accesses made by the first entity, i.e. the sequence of accesses made by the first entity prior to accessing the specified region 218. The trigger unit 311 can then compare the preceding sequence of accesses made by the first entity with the required sequence of accesses as specified by the first entity's access rights (which the trigger unit may read from memory 214 via interface 309). If the sequences match, the trigger unit 311 determines that the first entity has not breached its access rights. On the other hand, if the sequences do not match, the trigger unit determines that the first entity has breached its access rights.

The transaction buffer 301 may additionally store, for each monitored transaction, an indication of each subsystem or component (if any) via which the access was requested. This information may be determined from suitable fields of the transactions (e.g. address fields). In response to data for a transaction between the first entity and the specified region being stored in the transaction buffer, the trigger unit 311 can read from the transaction buffer the identities of each subsystem or component (if any) via which the transaction was routed, i.e. the components or subsystems via which access to the specified region 218 was requested. The trigger unit can then compare the identities of these components/subsystems with a list of prohibited components/subsystems specified by the access rights of the first entity. If the comparison reveals that the components/subsystems via which the monitored transaction was routed match one or more of the prohibited components/subsystems, the trigger unit determines that the first entity has breached its access rights. If on the other hand the trigger unit determines from the comparison that the components/subsystems via which the monitored transaction was routed do not match any of the prohibited components/subsystems, the trigger unit identifies that the first entity has not breached its access rights.

Clock 303 maintains a record of current time. The clock 303 operates according to a clocking frequency. The timestamp unit 313 operates to apply a timestamp to the monitored transactions as data for those transactions are stored in the transaction buffer. The timestamp unit allocates a time to the timestamp in accordance with the time according to clock 303. The timestamps for each monitored transaction can then be stored in the transaction buffer. Thus, the transaction buffer may store an indication (e.g. an ID) of each monitored transaction between the first entity and the specified region 218, and an associated timestamp for each of those transactions.

The trigger circuit 311 is coupled to the transaction buffer and can access this buffer to determine from the transactions and their associated timestamps whether the first entity has breached its access rights to the specified region 218. For example, each time data for a transaction between the first entity and the specified region is stored in the buffer 301, the trigger circuit 311 may read the timestamp associated with that transaction and compare that timestamp with the limiting value defined by the access rights. If the comparison indicates that the timestamp corresponds to a time in which the first entity is not permitted access to the specified region, the trigger unit identifies that the first entity has breached its access rights. If the comparison indicates that the timestamp corresponds to a time in which the first entity is permitted access to the specified region, the trigger unit identifies that the first entity has not breached its access rights.

Counter 305 operates to maintain a count of the number of accesses to the specified region made by the first entity over a specified time period. That is, the counter 305 operates to maintain an indication of the frequency of accesses to the specified region made by the first entity. The specified time period may be programmable. It may be set during the configuration stage of the chip. To maintain this count value, the counter may be coupled to the transaction buffer 301 to read the number of transactions within the specified time period using transaction indications and the associated timestamp information stored in the buffer. The transaction indications can be used to determine the total number of accesses made by the first entity, and the associated timestamp information can be used to identify the number of transactions within the specified time period.

The counter 305 may maintain a count of the number of accesses within each of a temporally contiguous set of time periods. That is, the counter may maintain a count of the number of accesses within a specified time period T. After the expiry of the time period, the counter value is reset and the number of accesses within the next time period T is counted. In other words, the count value may be reset after each time period T. Alternatively, the counter 305 may maintain a count of the number of accesses within a sliding window of specified time period T.

The counter 305 may be coupled to the trigger unit 311 to allow the counter to output its count value for a specified time period T to the trigger unit. The trigger unit 311 may then compare the count value with the limiting count value defined by the access rights. If the comparison indicates that the first entity has exceeded the maximum number of accesses to the specified region 218 permitted within the specified time period T (i.e. the first entity has exceeded its maximum permitted frequency of access), the trigger unit 311 identifies that the first entity has breached its access rights. On the other hand, if the comparison indicates that the first entity has not exceeded the maximum number of accesses to the specified region within the specified time period T (i.e. the frequency of access by the first entity is below the maximum permitted value), the trigger unit determines that the first entity has not exceeded its access rights.

If the access rights specify a maximum frequency of access for a number of different access types, monitoring circuitry 104 may comprise a plurality of counters, where each counter is operable to count the number of access of a respective type made by the first entity within the specified time period T. The access type may be specified within the transaction, and an indication of access type may be stored for each monitored transaction within the transaction buffer. The trigger unit 311 may then compare each counter value with a respective limiting count value to determine whether the first entity has breached its access rights.

The state memory 307 stores an indication of the state of the chip 100. The state memory 307 may store the current state of the chip 100. Example chip states include: a reset state; a bootstrap state; sleep state; an operational mode of the chip etc. The operational mode of the chip may be determined by the type of network in which the chip is operating (e.g. a 3G network or a 4G network). The status stored in the state memory 307 may change upon transition of the chip from one state to another. The state memory 307 may be configured to receive an input signal indicating the state of the chip. This signal may originate from another component of the chip 100, such as one of the chip's core devices, for example the chip's central processor, or controller unit. Alternatively, the signal input into the state memory may be a user-defined signal. In other words, the state may be programmable.

The state memory is shown coupled to the trigger unit 311. The trigger unit 311 may read the value in the state memory 307 each time data for a transaction between the first entity and the specified region 218 is stored in the transaction buffer 301. The trigger unit can compare the value in the state memory 307 with the limiting value for this access parameter defined by the access rights to determine whether the first entity has breached its access rights. That is, the trigger unit can compare the value in the state memory with the limiting value for each transaction between the first entity and the specified region. If the comparison indicates that a transaction occurred at a time when the chip status was one in which access to the specified region is not permitted, the trigger unit determines that the first entity has breached its access rights. If the comparison indicates that the transaction occurred at a time when the chip status was one in which access to the specified region is permitted, the trigger unit determines that the first entity has not breached its access rights.

The exemplary monitoring circuitry 104 shown in FIG. 3 contains functional components for determining access parameter values to identify a set of potential access right breaches. It will be appreciated that the circuitry shown in FIG. 3 is merely exemplary, and that the circuitry may contain a greater or fewer number of functional blocks depending on the number of potential access rights the circuitry is arranged to be able to detect. For example, other examples of monitoring circuitry may not contain one or more of the state memory; counter; clock; or timestamp unit.

Referring now back to FIG. 4, and at step 405 the monitoring circuitry performs a dedicated action in response to identifying from the determined access parameter values that the first entity has breached its access rights.

The dedicated action performed by the monitoring circuitry 104 may be indicative of the fact the access rights have been breached. The dedicated actions may be remedying actions to remedy the breach in access rights. The dedicated actions may be preventative actions to prevent further accesses to the specified region 218 by the first entity. The dedicated actions may be alerting actions to alert a component that the first entity has breached its access rights. The dedicated actions may be a security response. That is, the dedicated action may be a response to safeguard the security of the specified region.

Examples of dedicated actions capable of being performed by the monitoring circuitry 104 include: blocking further access to the specified region 218 for the first entity; blocking further accesses of a specific type (e.g. read or write accesses); generating an alert signal that is output from the monitoring circuitry (and potentially output from the chip 100 to an off-chip component such as debug controller 216); and outputting trace data of the access to the specified region by the first entity. The monitoring circuitry may perform one or more of these dedicated actions in response to determining that the access rights have been breached. Any combination of these dedication actions may be performed. The dedicated actions may be performed by the triggering unit 311.

To prevent the first entity gaining further access to the specified region 218, the monitoring circuitry may assert a lock on pathways between the first entity and the specified region. The asserted lock restricts some or all communications along the pathway. The asserted lock may therefore restrict the passage of all communications from the first entity to the specified region along the pathway. Alternatively, the asserted lock may restrict only access requests of a specific type.

Trace data for the accesses may be collected in the transaction buffer 301. Alternatively, the trace data may be collected by a dedicated debugging unit forming part of the monitoring circuitry.

By monitoring an entity's access to the specified on-chip region, and taking responsive action when the entity breaches its access rights, the monitoring architecture described above can assist in safeguarding the security of the chip 100 from malicious entities. Furthermore, because the monitoring architecture is embedded within the integrated circuit chip and capable of outputting data of access breaches off-chip, the security of the chip can be monitored and secured in a non-intrusive manner.

Various examples of how the monitoring circuitry can determine whether the first entity has breached its access rights have been described above. In some implementations, the monitoring circuitry may vary the access parameter values it determines from the monitored transactions over time. That is, the access parameter values used by the monitoring circuitry to determine whether there's been a breach of access might not be fixed but may vary over time. That is, the access parameter values determined from the transactions may be configurable, for example during run-time of the chip. The access parameter values used to test for a breach of access rights may be varied, or reconfigured, by the monitoring circuitry 104. The monitoring circuitry may for example reconfigure the access parameter values used to test for a breach of access rights in dependence on the state of the chip 100. A detected change in the state of the chip may cause the monitoring circuitry to change the parameter access values it determines from the monitored transactions. This may be a convenient approach to efficiently detect a breach of access rights without requiring the full set of access parameter values to be determined at all times, since certain types of access right breach may be more or less likely to occur for different chip states. In other words, changing the access parameter values used to detect an access right breach over time may reduce the amount of processing required by the monitoring circuitry to detect a breach of access rights.

As another example, the monitoring circuitry may determine values for a first set of one or more access parameters from monitored transactions, and if those values satisfy a set of specified conditions, subsequently operate to determine values of a second set of one or more access parameters, either from those same monitored transactions used to determine the first set of access parameter values, or for subsequently monitored transactions. The specified conditions may be indicative (but not confirmatory) of an access right breach. The second set of access parameters may include the access parameters of the first set. The first set of access parameters may require less computational effort to determine values for than the second set. This approach may be useful for controlling the amount of processing performed by the monitoring circuitry by limiting the more expensive processing to situations where an access rights breach is more likely.

In the examples described above, the monitoring circuitry operated to perform a dedicated action in response to identifying that a first entity has breached its access rights. In other examples, the monitoring circuitry can be configured to additionally perform one or more dedicated actions in response to the first entity making an uncharacteristic access to the specified region. That uncharacteristic action may in itself not breach the first entity's access rights.

To do this, the monitoring circuitry 104 may use the monitored transactions between the first entity and specified region 218 to record information associated with accesses of the first entity to the specified region over time. The recorded information can be used to generate an access profile for the first entity. That access profile may be composed of one or more parameters, referred to herein as profile parameters. A set of values for the profile parameters may define the access profile. These values may be referred to as profile values.

The monitoring circuitry can then analyze one or more monitored transactions between the first entity and the specified region 218 to determine whether a corresponding set of one or more accesses made by the first entity matches the generated access profile. If the monitoring circuitry determines from this analysis that a set of one or more accesses by the first entity does not match the generated access profile, the monitoring circuitry can perform the one or more dedicated actions described above with reference to step 405.

To build up the access profile, the monitoring circuitry may record information (e.g. statistics) on the accesses to the specified region made by the first entity over time. The monitoring circuitry may for example generate the access profile by populating a histogram of recorded values for one or more of the profile parameters. The value of a profile parameter may be taken as an average of a set of recorded values. The access profile may be updated over time as information associated with more transactions between the first entity and specified region are recorded. That is, the parameter profile values may not be static but may change over time as more accesses to the specified region are recorded (i.e. as more transactions between the first entity and specified region are monitored and analyzed). The values of the profile parameters could for example be averaged over time.

A profile unit 315 may be provided in the monitoring circuitry 104 to calculate or update one or more of the profile parameter values using the recorded information associated with the accesses to the specified region by the first entity. The profile unit could for example calculate a parameter profile value as the average of a set of recorded values over time.

The information associated with the accesses to the specified region by the first entity used to generate and update the access profile is determined from an analysis of the monitored transactions between the first entity and the specified region. One or more of the transaction buffer 301, timestamp unit 313 and clock 303, counter 305 and state unit 307 may be used to generate and update the profile parameter values.

An example profile parameter could be, for example, the number of accesses to the specified region over a specified time interval (i.e., a frequency of accesses to the specified region by the first entity). It could be the number of accesses over a specified time interval for each of a set of different access types. Values for this parameter may be determined by the transaction buffer 311, timestamp unit 313 and clock 303, and counter 305 (e.g. in an analogous manner to that described above with reference to step 403). These values could be used by the profile unit 315 to populate a histogram of frequencies, or frequencies per access type, and/or used to determine an average frequency of access to the specified region, or average frequency of access per access type.

Another example profile parameter may be the order of accesses to on-chip regions of chip 100 made by the first entity. The parameter could for example be a sequence of accesses made by the first entity. It could be a sequence of accesses made by the first entity prior to accessing the specified region 218. The sequence of accesses may of a fixed, predetermined length. Values for this parameter could be determined by the transaction buffer 301. These values could be used by the profile unit to populate a histogram of different access sequences.

Another example profile parameter is the time the accesses to the specified region are made by the first entity. Values for this parameter may be determined by the clock 303, timestamp unit 313 and transaction buffer 301. These values may be used by the profile unit 315 to populate a histogram of access times and/or used to determine an average access time.

The recorded information and access profile may be stored in a storage unit. That storage unit may be located within the monitoring circuitry 104 or externally of the monitoring circuitry. In the example shown in FIG. 3, the storage unit is in the form of a profile parameter buffer 317 which stores the values of the profile parameters as these are determined from monitored transactions between the first entity and specified region 218 by the profile unit 315. In other examples, the storage unit could form part of the memory 214. In this case, values of the profile parameters can be communicated to the memory 214 via the memory interface 309.

To determine whether a set of one or more accesses to the specified region 218 made by the first entity matches the access profile of that entity, values of the profile parameters for those one or more accesses can be compared by the trigger unit 311 with the values of those profile parameters defining the access profile. The values of the profile parameters for the set of one or more accesses can be determined by the profile unit 315 from the corresponding set of one or more monitored transactions between the first entity and the specified region 218. The values of the profile parameters for the set of one or more accesses can be stored in the parameter buffer 317.

The trigger unit 311 may determine that the set of one or more accesses do not match or comply with the access profile if the values of the profile parameters for the set of one or more accesses does not match, to within a specified tolerance, the values of the profile parameters defining the access profile. The trigger unit may determine that the set of one or more accesses does not match the access profile if the value of at least one profile parameter does not match the value defining the access profile to within a predetermined amount. The trigger unit may alternatively determine that the set of one or more accesses does not match the access profile only if the values of all the profile parameters do not match the values defining the access profile to within a predetermined amount.

In another example, the monitoring circuitry may additionally be configured to perform one or more dedicated actions in response to a set of accesses to the specified region being made that do not match typical accesses to that region.

To do this, the monitoring circuitry 104 may use the monitored transactions involving the specified region 218 to record information associated with accesses to the specified region over time. These accesses may be made by the first entity. The accesses may be made by one or more entities, which may or may not include the first entity. In this example, an access profile for the specified region 218 may be generated (in contrast to the example above in which the access profile was generated for a specific entity). This access profile can again be composed of one or more profile parameters. A set of values for the profile parameters may define the access profile for the specified region. These values may be referred to again as profile values.

The monitoring circuitry 304 can then analyze one or more transactions involving the specified region 218 to determine whether a set of one or more accesses to the specified region matches the generated access profile for the specified region. The set of one or more accesses may be made by one or more different entities. If the monitoring circuitry 304 determines from this analysis that a set of one or more accesses does not match the generated access profile for the specified region, the monitoring circuitry can perform the one or more dedicated actions described above with reference to step 405. Thus, by generating an access profile for the specified region, rather than for a specific entity, uncharacteristic accesses can be identified and remedying action taken regardless of which entity made the accesses.

To build up the access profile for the specified region, the monitoring circuitry 304 may record information (e.g. statistics) on the accesses to the specified region (made by one or more entities) over time. The profile parameters may be similar to those described in the example above. They could for example be associated with a histogram of recorded values; the value of a parameter may be taken as an average of a set of recorded values etc.

The profile unit 315 may calculate or update one or more of the profile parameter values using the recorded information associated with the accesses to the specified region. The information associated with the accesses to the specified region used to generate and update the access profile is determined from an analysis of the monitored transactions involving the specified region (i.e. transactions other than those between the first entity and specified region may be used). One or more of the transaction buffer 301, timestamp unit 313 and clock 303, counter 305 and state unit 307 may be used to generate and update the profile parameter values.

Example profile parameters for the access profile of the specified region include: the number of accesses to the specified region over a specified time interval (i.e., a frequency of accesses to the specified region by one or more entities); the number of specified types of accesses to the specified region over a specified time interval (e.g., the number of read accesses over a specified time interval, the number of write accesses over a specified time interval, the number of interrupts over a specified time interval, etc); a sequence of accesses to on-chip regions; and the time of the accesses to the specified region.

Similarly to the example above, the recorded information and access profile for the specified region may be stored in a storage unit, which could be parameter buffer 317 or memory 214.

The trigger unit 311 may compare values of the profile parameters determined from a set of one or more accesses to the specified region with the values of those profile parameters defining the access profile for the specified region 218. The values of the profile parameters for the set of one or more accesses can be determined by the profile unit 315 from the corresponding set of one or more monitored transactions involving the specified region 218. The values of the profile parameters for the set of one or more accesses can be stored in the parameter buffer 317.

The trigger unit may determine that the set of one or more accesses do not match or comply with the access profile of the specified region if the values of the profile parameters for the set of one or more accesses does not match, to within a specified tolerance, the values of the profile parameters defining the access profile. The trigger unit may determine that the set of one or more accesses does not match the access profile if the value of at least one profile parameter does not match the value defining the access profile to within a predetermined amount. The trigger unit may alternatively determine that the set of one or more accesses does not match the access profile only if the values of all the profile parameters do not match the values defining the access profile to within a predetermined amount.

In summary, according to the examples described above the monitoring circuitry may be configured to perform one or more dedicated actions in response to identifying one or more of the following conditions: i) that a first entity has breached its access rights to a specified region; ii) that a set of one or more accesses made by the first entity to the specified region do not match a generated access profile for the first entity; and iii) that a set of one or more accesses to the specified region (made by one or more different entities) do not match a generated access profile for the specified region.

The monitoring circuitry may be configured to identify only a single one of conditions i), ii) or iii). Alternatively, the monitoring circuitry may be configured to identify two of conditions i), ii) and iii) (e.g. conditions i) and ii); i) and iii); ii) and iii); or the monitoring circuitry may be configured to identify all three conditions. In some implementations, the monitoring circuitry 104 may determine which of conditions i), ii) and iii) to identify. The monitoring circuitry may reconfigure which of the conditions it identifies, for example over time; in dependence on the chip state; or in dependence on a security or safety level. For example, for higher security and/or safety levels, the monitoring circuitry may configure itself to identify each of conditions i), ii) and iii); for an intermediary security and/or safety level, the monitoring circuitry may configure itself to identify two of conditions i), ii) and iii); and for a lower security and/or safety level, the monitoring circuitry may configure itself to identify one of conditions i), ii) and iii).

The monitoring circuitry 104 described herein may be configured to operate for the purpose of chip safety, chip security or chip analytics. Chip security may relate to detecting abnormal activity on the chip that has potential malicious intent for the purpose of third party gain. Chip safety may relate to detecting abnormal activity on the chip that has more severe potential consequences, for example a dangerous effect on the wider system in which the chip is implemented. Chip analytics may relate to analyzing the behaviour of the chip to gain a further understanding of how the chip functions, or operates. Chip analytics may be performed by dedicated analytics software, potentially being executed off-chip.

The dedicated action performed by the monitoring circuitry may be dependent on the context in which the monitoring circuitry is operating (i.e. the context of chip safety, chip security or chip analytics). For chip security, the dedicated action performed by the monitoring circuitry may be to prevent a security breach from occurring. For chip safety, the dedicated action performed by the monitoring circuitry may be to prevent a safety breach from happening. For example, in the context of chip safety, a breach of access rights may cause the monitoring circuitry to perform a more severe dedicated action, such as shutting down or disabling the chip. The access rights monitored by the monitoring circuitry might also be dependent on the context in which the monitoring circuitry is operating. For chip security, the access rights monitored might be those whose breach indicates a breach of chip security; for chip safety, the access rights monitored might be those whose breach indicates a breach of chip safety. As mentioned above, the access rights monitored might be set, and be configurable by, the monitoring circuitry.

Examples have been described above in which the specified region 218 is a core device of the integrated circuit chip.

It will be appreciated that this is for the purposes of illustration only and that the specified region could be any suitable component; components; portion of the integrated circuit chip etc.

Examples have been described above with reference to a first entity. It will be appreciated that in practice access rights may be specified for one or more entities. The access rights of each entity may be monitored separately in accordance with the examples described herein.

Each component of the SoCs illustrated in FIGS. 1 to 3 may be implemented in dedicated hardware. Alternatively, each component of the SoC illustrated in FIGS. 1 to 3 may be implemented in software. Some components may be implemented in software, whilst other components are implemented in dedicated hardware.

The monitoring circuitry 104 including any sub-units and communication interfaces may be hardware circuits forming part of SoC 100. The components of the monitoring circuitry for controlling and/or monitoring complex core devices and peripherals such as processors may use suitably complex state machines as part of their control unit. Suitably, communication interfaces use suitably complex state machines to implement their complex protocols. Various approaches to realizing state machines are known. Such state machines can be realized using: (i) only logic gates; (ii) a combination of logic gates and memory, where the memory is used to contain tables of values to simplify the state machine's operation or to make it programmable; or (iii) a processor core to execute software stored in memory. Where a processor core is used it can be: (i) integral to the sub-unit, communication interface, or other monitoring circuitry; or (ii) shared between several units to reduce their implementation resources and cost.

The SoC described may be incorporated within a computing-based device. The computing-based device may be an electronic device, for example a smartphone, smartwatch, laptop, PC, or some other device that's a component part of a wider computing system, for example a video processor, a control system (e.g. for controlling electric motors, battery an energy management systems in automotive applications), an engine control unit (ECU) etc. Suitably, the computing-based device comprises one or more processors for processing computer executable instructions to control operation of the device in order to implement the methods described herein. The computer executable instructions can be provided using any computer-readable media such as a memory. The computer-readable media may be non-transitory. The methods described herein may be performed by software in machine readable form on a tangible storage medium. Software can be provided at the computing-based device to implement the methods described herein.

The above description describes the system circuitry and monitoring circuitry as being comprised on the same SoC. In an alternative implementation, the system circuitry and monitoring circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the monitoring circuitry may be distributed across more than one integrated circuit chip of the MCM. Thus, the method and apparatus described above in the context of an SoC also apply in the context of an MCM.

The monitoring circuitry 104 is illustrated in the examples herein as forming part of the integrated circuit chip. However, it will be understood that the monitoring circuitry (and its associated functionality as described herein) may be incorporated into an off-chip device, for example off-chip debugger 216. Such an off-chip device may include the blocks of the monitoring circuitry shown in FIG. 3.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit chip comprising:
   system circuitry comprising interconnect circuitry for transporting transactions; and
   monitoring circuitry configured to:
   monitor transactions from the interconnect circuitry comprising transactions between an entity and a specified region of the integrated circuit chip, the entity being associated with a set of one or more access rights for accessing the specified region of the integrated circuit chip;
   determine from the monitored transactions values of one or more parameters associated with the access to the specified region by the entity to identify whether the entity has breached its access rights; and
   perform a dedicated action indicative of a breach of the access rights in response to determining from the parameter values that the entity has breached its access rights.

2. The integrated circuit chip as claimed in claim 1, wherein the monitoring circuitry is configured to determine the values of the one or more parameters associated with the access to the specified region using the monitored transactions between the first entity and the specified region.

3. The integrated circuit chip as claimed in claim 1, wherein the access rights are specified in terms of limiting values of the one or more parameters associated with the access to the specified region and the monitoring circuitry is configured to compare the values of the one or more parameters associated with the access to the specified region determined from the monitored transactions with the limiting values of those one or more parameters to identify whether the entity has breached its access rights.

4. The integrated circuit chip as claimed in claim 1, wherein the one or more parameters associated with the access to the specified region include at least one of: a time value for each monitored transaction; the number of accesses to the specified region of the integrated circuit chip within a specified time interval; a state of the integrated circuit chip; a sequence of previous accesses made by the entity; whether the access was requested via a specified subsystem.

5. The integrated circuit chip as claimed in claim 1, wherein the dedicated action indicative of a breach of the entity's access rights comprises one or more of: blocking access to the specified region of the integrated chip circuit by the entity; generating an alert signal; and outputting trace data of accesses to the specified region by the entity.

6. The integrated circuit chip as claimed in claim 1, wherein the entity is located on the integrated circuit chip.

7. The integrated circuit chip as claimed in claim 1, wherein the entity is a hardware entity.

8. The integrated circuit chip as claimed in claim 1, wherein the entity is a logical entity.

9. The integrated circuit chip as claimed in claim 1, wherein the specified region is a memory on the integrated circuit chip.

10. The integrated circuit chip as claimed in claim 1, wherein the monitoring circuitry is configured to record in a storage unit information associated with accesses of the entity to the specified region over time to generate an access profile for the entity composed of one or more profile parameters.

11. The integrated circuit chip as claimed in claim 10, wherein the monitoring circuitry is configured to analyze a set of one or more monitored transactions between the entity and the specified region to determine whether a corresponding set of accesses by the entity matches the generated access profile, and the monitoring circuitry is configured to perform the dedicated action further in response to determining that a set of one or more accesses by the entity does not match the generated access profile.

12. The integrated circuit chip as claimed in claim 10, wherein the profile parameters include one or more of: frequency of accesses to the specified region by the entity; frequency of one or more types of access to the specified region by the entity; a sequence of accesses to regions of the integrated circuit chip by the entity.

13. The integrated circuit chip as claimed in claim 12, wherein the one or more types of access to the specified region include at least one of: frequency of read accesses; frequency of write access; frequency of interrupts.

14. The integrated circuit chip as claimed in claim 1, wherein the monitoring circuitry is further configured to use the monitored transactions to record in the storage unit information associated with accesses to the specified region of the integrated circuit chip over time to generate an access profile for the specified region composed of one or more profile parameters.

15. The integrated circuit chip as claimed in claim 14, wherein the monitoring circuitry is configured to analyze a set of one or more monitored transactions involving the specified region to determine whether a corresponding set of accesses to the specified region matches the generated access profile for the specified region, and the monitoring circuitry is configured to perform the dedicated action further in response to determining that a set of accesses to the specified region does not match the access profile for the specified region.

16. The integrated circuit chip as claimed in claim 14, wherein the one or more profile parameters composing the access profile for the specified region comprise at least one of: frequency of accesses to the specified region; frequency of types of accesses to specified region; timing of accesses to the specified region.

17. The integrated circuit chip as claimed in claim 16, wherein the frequency of one or more types of access to the specified region include at least one of: frequency of read accesses; frequency of write access; frequency of interrupts.

18. The integrated circuit chip as claimed in claim 1, wherein the monitoring circuitry is configured to monitor transactions for chip security, chip safety and/or during chip analytics.

19. A method of controlling access to a specified region of an integrated circuit chip, comprising:
   monitoring transactions over interconnect circuitry of the integrated circuit chip comprising transactions between an entity and the specified region of the integrated circuit chip, the entity being associated with a set of one or more access rights to the specified region of the integrated circuit chip;
   determining from the monitored transactions between the entity and the specified region of the integrated circuit chip values of one or more parameters associated with the access to the specified region by the entity to identify whether the entity has breached its access rights; and
   in response to determining from the parameter values that the entity has breached its access rights, performing a dedicated action indicative of a breach of those access rights.

20. The method as claimed in claim 1, wherein the method is performed for chip security, chip safety and/or during chip analytics.

* * * * *